US010679697B2

(12) United States Patent
Lei et al.

(10) Patent No.: US 10,679,697 B2
(45) Date of Patent: Jun. 9, 2020

(54) READ CIRCUIT OF STORAGE CLASS MEMORY WITH A READ REFERENCE CIRCUIT, HAVING SAME BIT LINE PARASITIC PARAMETERS AND SAME READ TRANSMISSION GATE PARASITIC PARAMETERS AS MEMORY

(71) Applicant: SHANGHAI INSTITUTE OF MICROSYSTEM AND INFORMATION TECHNOLOGY, CHINESE ACADEMY OF SCIENCES, Changning District, Shanghai (CN)

(72) Inventors: Yu Lei, Shanghai (CN); Houpeng Chen, Shanghai (CN); Xi Li, Shanghai (CN); Qian Wang, Shanghai (CN); Zhitang Song, Shanghai (CN)

(73) Assignee: SHANGHAI INSTITUTE OF MICROSYSTEM AND INFORMATION TECHNOLOGY, CHINESE ACADEMY OF SCIENCE, Changning District, Shanghai (CN)

(*) Notice: Subject to any disclaimer, the term of this patent is extended or adjusted under 35 U.S.C. 154(b) by 0 days.

(21) Appl. No.: 15/739,724

(22) PCT Filed: Aug. 25, 2016

(86) PCT No.: PCT/CN2016/096649
§ 371 (c)(1),
(2) Date: Dec. 23, 2017

(87) PCT Pub. No.: WO2017/215119
PCT Pub. Date: Dec. 21, 2017

(65) Prior Publication Data
US 2018/0190351 A1   Jul. 5, 2018

(30) Foreign Application Priority Data

Jun. 17, 2016 (CN) .......................... 2016 1 0435780

(51) Int. Cl.
*G11C 13/00* (2006.01)
*G11C 7/14* (2006.01)

(52) U.S. Cl.
CPC .............. *G11C 13/004* (2013.01); *G11C 7/14* (2013.01); *G11C 13/0061* (2013.01);
(Continued)

(58) Field of Classification Search
CPC ..... G11C 13/004; G11C 13/0061; G11C 7/14; G11C 2207/002; G11C 2213/79; G11C 2213/72; G11C 2013/0054
See application file for complete search history.

(56) References Cited

U.S. PATENT DOCUMENTS 6,128,213 A * 10/2000 Kang ........................ G11C 8/08
                                                        365/145
6,574,160 B1 * 6/2003 Eleyan ..................... G11C 7/04
                                                        365/205
(Continued)

FOREIGN PATENT DOCUMENTS

CN           1838313 A       9/2006
CN         101976578 A       2/2011
(Continued)

*Primary Examiner* — Sultana Begum
(74) *Attorney, Agent, or Firm* — Global IP Services; Tianhua Gu (57) ABSTRACT

A read circuit of storage class memory comprises: an array; a read reference circuit, having the same bit line parasitic parameters as the array, having the same read transmission gate parasitic parameters as the array, used to generate a read reference current; a sense amplifier, providing the same current mirror parasitic parameters as the reference side, used to generate a read current from a selected memory cell, compare the said read current with the said read reference current and output a readout result. In the present invention, the said read current and the said read reference current are generated at the same time, the transient curve of the said (Continued)

read reference current is between the low resistance state read current and the high resistance state read current from an early stage. The present invention largely reduces the read access time, has a good process variation tolerance, has a wide application, and is easy to be used in the practical product.

14 Claims, 5 Drawing Sheets

(52) U.S. Cl.
CPC ............... *G11C 2013/0054* (2013.01); *G11C 2207/002* (2013.01); *G11C 2213/72* (2013.01); *G11C 2213/79* (2013.01)

(56) References Cited

U.S. PATENT DOCUMENTS

| | | | | |
|---|---|---|---|---|
| 2008/0101124 A1* | 5/2008 | Sivero | ................... | G11C 16/12 365/185.18 |
| 2012/0147664 A1* | 6/2012 | Rho | ................... | G11C 11/1673 365/158 |
| 2013/0235649 A1* | 9/2013 | Lindstadt | ........... | G11C 13/0035 365/148 |

FOREIGN PATENT DOCUMENTS

| | | |
|---|---|---|
| CN | 103295626 A | 9/2013 |
| CN | 104347113 A | 2/2015 |
| CN | 106205684 A | 12/2016 |

\* cited by examiner

FIG.1

(Prior Art)

READ CIRCUIT OF STORAGE CLASS MEMORY WITH A READ REFERENCE CIRCUIT, HAVING SAME BIT LINE PARASITIC PARAMETERS AND SAME READ TRANSMISSION GATE PARASITIC PARAMETERS AS MEMORY

CROSS REFERENCE TO RELATED PATENT APPLICATION

The present application is the US national stage of PCT/CN2016/096649 filed on Aug. 25, 2016, which claims the priority of the Chinese patent application No. CN2016104357801 filed on Jun. 17, 2016, which application is incorporated herein by reference.

BACKGROUND OF THE PRESENT INVENTION

Field of Invention

The present invention relates to storage class memory, and more particularly to read circuit of storage class memory.

Description of Related Arts

Storage class memory (SCM) is a type of non-volatile memories that have both dynamic random access memory (DRAM)-like performance and storage-like non-volatility. Storage class memory blurs the distinction between Memory (fast, expensive, volatile) and Storage (slow, cheap, non-volatile). Features of storage class memory includes: solid state, short access time, low cost per bit and non-volatile. Examples of storage class memory include phase change memory (also known as phase change random access memory, PCRAM, PCM), magneto resistive random access memory (MRAM), resistive random access memory (RRAM) and so on. The storage mechanism of many storage class memories is based on reversible transitions between low resistance state (LRS) and high resistance state (HRS) of memory devices. The memory cell of storage class memory comprises a memory device and a select device (selector). Both NMOS transistor and diode can be used as a select device. The memory cell is coupled with a bit line through a word line. Word line controls the select device. On each bit line, there are multiple cells coupled through word lines. Several bit lines share a sense amplifier (SA) or a writer-driver. Read operation is achieved by measuring the resistance of the addressed memory cell. The cell state can be characterized by comparing the read current (voltage) with a read reference current (voltage).

Read access time or read latency is a key parameter for memory and storage. In memory, latency of SRAM and DRAM is within 30 ns; in storage, latency of NAND flash is about 50 μs, latency of 3D-NAND flash is about 500 μs, and latency of hard disk is about 10 ms. Storage class memory wants to achieve the read access time that can compete with DRAM. But there are some obstacles for storage class memory to read that fast.

As a continuous growth in scalability, parasitic parameters in the array have been a major obstacle in reducing the read access time. Parasitic parameters can be divided into three categories: bit line parasitic parameters, read transmission gate parasitic parameters, sense amplifier's current mirrors parasitic parameters. Bit line parasitic parameters are related to bit line length. In memory design, bit line length is 512, 1024, etc. A larger bit line length means a bigger capacity for chip, but at the same time, larger parasitic parameters will increase the read access time. Major bit line parasitic parameters include parasitic resistors and capacitors of both metal lines and select devices. Read transmission gate parasitic parameters, which include parasitic resistors and capacitors of read transmission gate, are related to the number of bit lines sharing a sense amplifier. Sense amplifier's current mirrors parasitic parameters are related to the number of sense amplifiers in the array. Sense amplifier uses current mirror to copy read reference current. Considering parasitic capacitors on the gate of transistor, current mirror will switch on slowly if there are many transistors coping one current. In memory design, a lot of sense amplifiers are needed. These will cause mismatch between current mirror of read current and current mirror of read reference current and also differences of changing trend between two currents' transient curves. These three kinds of parasitic parameters will lead to a high read current. If a constant reference current is still being used, the read access time will be long.

Figure 1:
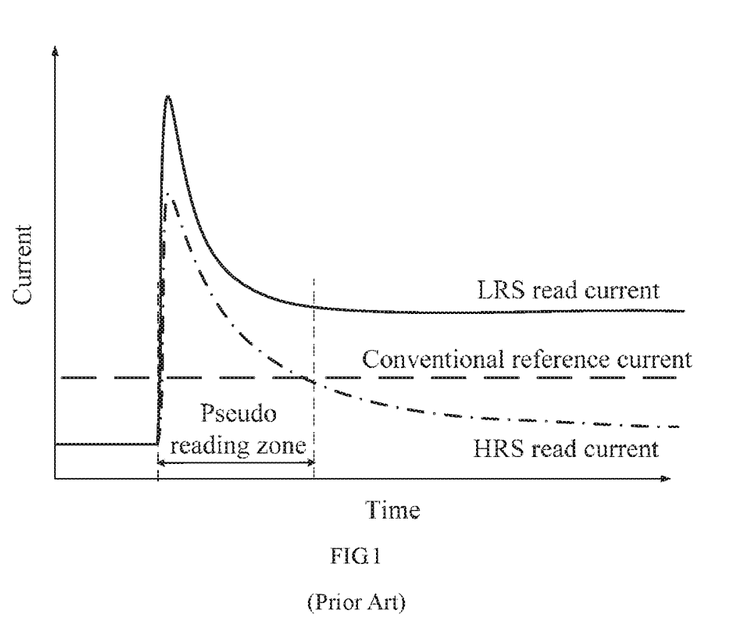
FIG. 1 illustrates comparison between the read current and the read reference current and the impact of pseudo reading zone in the prior art.

FIG. 1 shows comparison between the read current and the read reference current and the impact of pseudo reading zone in the prior art. At first, LRS read current and HRS read current rise to their maximum currents. Then they begin to drop in natural exponential curves, just the same as a capacitor charging process. Due to their resistance difference, LRS read current is higher than HRS read current when they reach a stable value. In the conventional method, the read reference current is independent of time. When reading a HRS selected cell, the sense amplifier will not output a correct result until HRS read current is lower than the read reference current. A long pseudo reading zone is therefore created and expands the read access time.

Phase change memory is a storage class memory which has the potential to overcome performance and scalability limits of currently dominant flash memories. The storage mechanism of phase change memory is based on reversible phase change transitions of a chalcogenide alloy ($Ge_2Sb_2Te_5$, etc) between a high resistance in the amorphous state (reset state or HRS for data "0") and a low resistance in the crystalline state (set state or LRS for data "1"). The memory cell of phase change memory comprises a memory device and a select device. Both NMOS transistor and diode can be used as a select device, and the so-called memory cells are 1T1R cell and 1D1R cell. Designed in a 130 nm CMOS process, the read access time of 128K PCM with 1024 bit line length is about 80 ns.

Therefore, there is a need to improve the read access time or the read speed for a higher performance storage class memory.

SUMMARY OF THE PRESENT INVENTION

In view of the disadvantages of the prior art, an object of the present invention is to provide a read circuit of storage class memory, which is used for solving the problem that read circuit of storage class memory has a long read access time in the prior art.

In order to realize the above-mentioned object and other related objects, the present invention provides a read circuit of storage class memory. The said read circuit at least comprises: an array, including at least one memory block and a sense amplifier used to read the memory block, wherein bit lines in each said memory block are connected to the said sense amplifier through a read transmission gate; a read reference circuit, having the same bit line parasitic parameters as the said array, having the same read transmission gate parasitic parameters as the said array, used to generate a read reference current which is between the low resistance state read current and the high resistance state read current from an early stage; wherein the said sense amplifier, used to generate read current from a selected memory cell, compare the read current with read reference current provided by the said read reference circuit and output a readout result.

Optionally, the said read reference circuit comprises a reference cell comprising a reference resistance and a first select device, used to provide a reference resistance to distinguish low resistance state from high resistance state.

Optionally, the said reference resistance is connected between the said first select device and a first read transmission gate, wherein control terminal of the said first select device is controlled by enable signal.

Optionally, the said reference resistance is set between the highest resistance in low resistance state distributions and the lowest resistance in high resistance state distributions.

Optionally, the said read reference circuit further comprises n−1 dummy memory cells providing the same bit line parasitic parameters as the said array, wherein n is the number of memory cells on each bit line in the said array.

Optionally, each said dummy memory cell comprises a first memory device and a second select device which is always switched off, wherein the said first memory device is connected between the said second select device and the said first read transmission gate.

Optionally, the said read reference circuit further comprises a dummy read transmission gate, connected between the source of a first nMOS transistor and the ground, used to provide the same read transmission gate parasitic parameters as the said array for the said read reference current.

Optionally, the said dummy read transmission gate shares a same circuit topology, width and length with the said first read transmission gate and the read transmission gate in the said array; multiplier of the said dummy read transmission gate is m−1, wherein m is the number of bit lines sharing a sense amplifier; the said dummy read transmission gate is always switched off with its control terminal connected to the ground.

Optionally, the said read reference circuit further comprises a first pMOS transistor and the said first nMOS transistor, wherein the said first nMOS transistor used to generate the said read reference current from the said reference cell, the said n−1 dummy memory cells, the said first read transmission gate and the said dummy read transmission gate with the help of a clamp voltage, wherein the said first pMOS transistor is used as a current mirror to transmit said read reference current to the said sense amplifier.

Optionally, the source of the said first nMOS transistor is connected to the said first read transmission gate with the gate of the said first nMOS transistor connected to the said clamp voltage, wherein the drain of the said first nMOS transistor is connected to the drain of the said first pMOS transistor, wherein the source of the said first pMOS transistor is connected to the supply voltage with the gate of the said first pMOS transistor connected to the drain of the said first pMOS transistor, wherein the gate of the said first pMOS transistor outputs a read reference voltage.

Optionally, the said reference circuit and the said sense amplifier begin to work at the same time.

Optionally, the said read reference current and the said read current begin to rise at the same time.

Optionally, the said memory block includes multiple memory cells, wherein only one word line and one bit line will be simultaneously selected at the same time; each said memory cell comprises a second memory device and a third select device, wherein the said second memory device is connected between bit line and the said third select device, wherein the said third select device is controlled by word line; in each memory block, there are n memory cells connected to each bit line, m bit lines sharing a sense amplifier; there are b sense amplifiers connected to a same read reference circuit in the said array; values of n, m and b are not limited to a specific value, and they can be set according to actual needs.

Optionally, the said sense amplifier comprises a second nMOS transistor used to generate the read current from the selected memory cell, a first current mirror used to copy the said read current, a second current mirror used to copy the said read reference current and a comparator used to compare the said read current and the said read reference current, wherein the gate of the said second nMOS transistor is connected to the said clamp voltage, wherein the source of the said second nMOS transistor is connected to the selected memory cell through a read transmission gate, wherein the said first current mirror is connected to the drain of the said second nMOS transistor, wherein the gates of the transistors of the said second current mirror are connected to the said read reference voltage, wherein the said comparator is connected to the said first current mirror and the said second current mirror, wherein the said comparator outputs a readout result representing state of the memory device.

Optionally, the said sense amplifier further comprises a current mirror parasitic parameters matching circuit used to provide the same current mirror parasitic parameters as the reference side for the said read current.

Optionally, the said current mirror parasitic parameters matching circuit comprises a second pMOS transistor used to provide the same current mirror parasitic parameters as the reference side for the said read current and a third nMOS transistor used to switch off the said second pMOS transistor and the said third nMOS transistor.

Optionally, the source and the drain of the said third nMOS transistor are connected to the ground with the drain of the said third nMOS transistor connected to the drain of the said second pMOS transistor, wherein the source of the said second pMOS transistor is connected to the supply voltage, wherein the gate of the said second pMOS transistor is connected to the transistors' gates of the said first current mirror, wherein the said second pMOS transistor have the same width and length with the said first current mirror and the said second current mirror, wherein multiplier of the said second pMOS transistor is 2(b−1), where b is the number of sense amplifiers in the said array.

As described above, the present invention which provides a read circuit of storage class memory has these advantages:

1. Different from the constant reference current in the prior art, in the present invention, it is not until the read signal is valid that the read reference circuit begins to operate, so the read reference circuit can generate a changing read reference current; considering parasitic parameters effect on the read current and the read reference current, the read circuit of storage class memory of the present invention provides the same bit line parasitic parameters and the same read transmission gate parasitic parameters as the array for the read reference current and the same current mirror parasitic parameters as the reference side for the said read current. By these two means, the transient curve of the read reference current is between the low resistance state read current and the high resistance state read current from an early stage. The present invention reduces the pseudo reading zone and the read access time.

2. In the present invention, the read reference circuit outputs the read reference voltage to sense amplifiers. Voltage signal transmits fast and can be multiplex in multiple sense amplifiers. It is very suitable for large scale memory. It is area-saving and energy-saving compared to conventional signal transmitting.

3. The present invention can reduce the read access time in application from 1 Kb to 1 Tb memory.

4. In the present invention, design of different parasitic parameters matching can be utilized by simple change of transistors' numbers. The present invention is easy to be used in the practical product.

5. The present invention is perfectly symmetric in terms of circuit topology and parasitic parameters. It has a big sensing margin and a good process variation tolerance.

BRIEF DESCRIPTION OF THE DRAWING

The invention is illustrated by way of example and not by way of limitation in the figures of the accompanying drawings in which like references indicate similar elements. It should be noted that references to "an" embodiment in this disclosure are not necessarily to the same embodiment, and they mean at least one.

DETAILED DESCRIPTION OF THE PREFERRED EMBODIMENTS

The implementation mode of the present invention will be described below through specific embodiments. One skilled in the art can easily understand other advantages and effects of the present invention according to contents disclosed by the description. The present invention can also be implemented or applied through other different specific implementation modes. Various modifications or changes can also be made to all details in the description based on different points of view and applications without departing from the spirit of the present invention. It needs to be stated that the following embodiments and the features in the embodiments can be combined with one another under the situation of no conflict.

It needs to be stated that the drawings provided in the following embodiments are just used for schematically describing the basic concept of the present invention, thus only illustrate components only related to the present invention and are not drawn according to the numbers, shapes and sizes of components during actual implementation, the configuration, number and scale of each component during actual implementation thereof may be freely changed, and the component layout configuration thereof may be more complex. Furthermore, it is to be understood that the various embodiments shown in the Figures are illustrative representations and are not necessarily drawn to scale.

Figure 2:
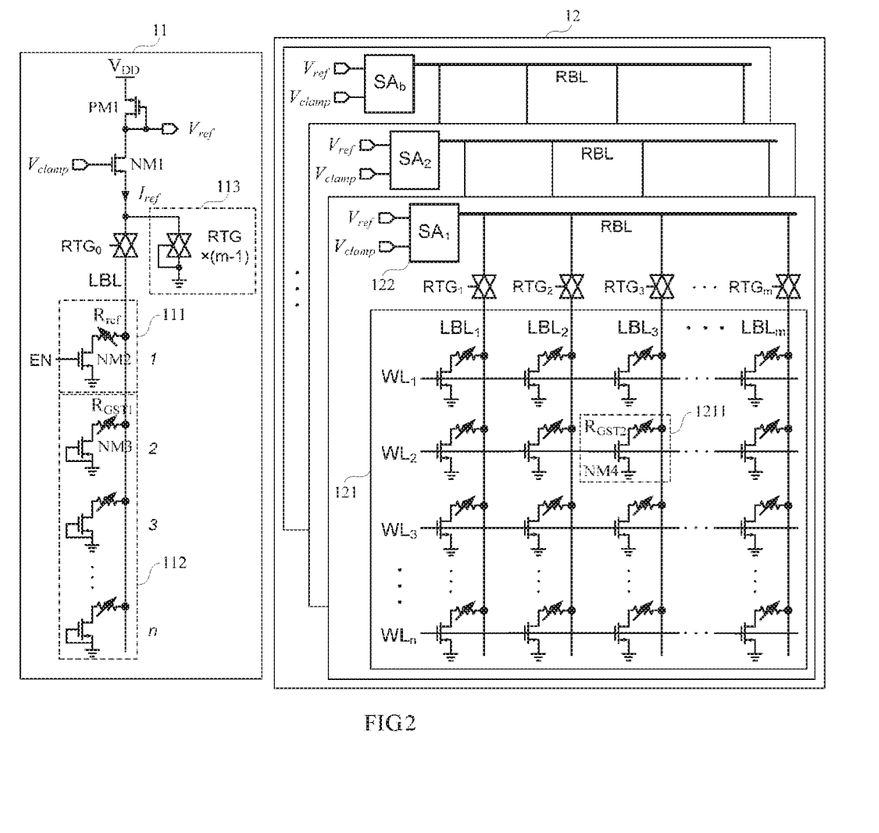
FIG. 2 is a conceptual schematic of the read reference circuit and the array for transistor-type selector application according to an embodiment of the invention.

As shown in FIG. 2, according to an embodiment of the invention, a read circuit of storage class memory comprises: an array 12, including at least one memory block 121 and a sense amplifier 122 used to read the said memory block 121, while bit lines in each said memory block are connected to the said sense amplifier 122 through a read transmission gate; a read reference circuit 11, having the same bit line parasitic parameters as the said array 12, having the same read transmission gate parasitic parameters as the said array 12, used to generate a read reference current $I_{ref}$ which is between the low resistance state read current and the high resistance state read current from an early stage; wherein the said sense amplifier 122, used to generate the read current $I_{read}$ from a selected memory cell, compare $I_{read}$ with the read reference current $I_{ref}$ provided by the said read reference circuit 11 and output a readout result.

As shown in FIG. 2, according to an embodiment of the invention, the said read reference circuit 11 comprises a reference cell 111 comprising a reference resistance $R_{ref}$ and a first select device NM2, used to provide a reference resistance to distinguish low resistance state from high resistance state. NM2 is an nMOS transistor. The said reference resistance $R_{ref}$ is connected between the drain of the said first select device NM2 and a first read transmission gate RTG0, the gate of the said first select device NM2 is controlled by enable signal EN. The said reference resistance $R_{ref}$ is set between the highest resistance in low resistance state distributions and the lowest resistance in high resistance state distributions.

As shown in FIG. 2, according to an embodiment of the invention, the said read reference circuit 11 further comprises n−1 dummy memory cells 112 providing the same bit line parasitic parameters as the said array 12, n is the number of memory cells on each bit line in the said array 12. Each said dummy memory cell comprises a first memory device $R_{GST1}$ and a second select device NM3 which is always switched off. NM3 is an nMOS transistor. The said first memory device $R_{GST1}$ is connected between the said second select device NM3 and the said first read transmission gate RTG0, the gate and the source of the said second select device NM3 is connected to the ground. In the read operation, there are one selected cell and n−1 unselected cells in the reference side; there are one selected cell and n−1 unselected cells in the read side. $I_{ref}$ has the same bit line parasitic parameters and similar changing trend with LRS $I_{read}$ and HRS $I_{read}$. $I_{ref}$ is between LRS $I_{read}$ and HRS $I_{read}$ from an early stage. This eliminates pseudo reading and reduces the read access time.

As shown in FIG. 2, according to an embodiment of the invention, the said read reference circuit 11 further comprises a dummy read transmission gate 113, connected between the source of a first nMOS transistor NM1 and the ground, used to provide the same read transmission gate parasitic parameters as the said array 12 for the said read reference current $I_{ref}$. The said dummy read transmission gate 113 shares a same circuit topology, width and length with the said first read transmission gate RTG0 and the read transmission gate RTGm in the said array 12. Multiplier of the said dummy read transmission gate 113 is m−1, wherein m is the number of bit lines sharing a sense amplifier 122. The said dummy read transmission gate 113 is always switched off with its control terminal connected to the ground. In the read operation, there are one selected read transmission gate and m−1 unselected read transmission gates in the reference side; there are one selected read transmission gate and m−1 unselected read transmission gates in the read side. $I_{ref}$ has the same read transmission gate parasitic parameters and similar changing trend with LRS $I_{read}$ and HRS $I_{read}$. $I_{ref}$ is between LRS $I_{read}$ and HRS $I_{read}$ from an early stage. This eliminates pseudo reading and reduces the read access time.

As shown in FIG. 2, according to an embodiment of the invention, the said read reference circuit 11 further comprises a first pMOS transistor PM1 and the said first nMOS transistor NM1. The said first nMOS transistor NM1 is used to generate the said read reference current $I_{ref}$ from the said reference cell 111, the said n−1 dummy memory cells 112, the said first read transmission gate RTG0 and the said dummy read transmission gate 113 with the help of a clamp voltage $V_{clamp}$. The said first pMOS transistor PM1 is used as a current minor to transmit the said read reference current $I_{ref}$ to the said sense amplifier 122. The source of the said first nMOS transistor NM1 is connected to the said first read transmission gate RTG0; the gate of the said first nMOS transistor NM1 is connected to the said clamp voltage $V_{clamp}$; the drain of the said first nMOS transistor NM1 is connected to the drain of the said first pMOS transistor PM1; the source of the said first pMOS transistor PM1 is connected to the supply voltage VDD; the gate of the said first pMOS transistor is PM1 connected to the drain of the said first pMOS transistor PM1; the gate of the said first pMOS transistor PM1 outputs a read reference voltage $V_{ref}$.

In an embodiment, the said reference circuit 11 and the said sense amplifier 122 begin to work at the same time. The said read reference current $I_{ref}$ and the said read current $I_{read}$ begin to rise at the same time.

Figure 3:
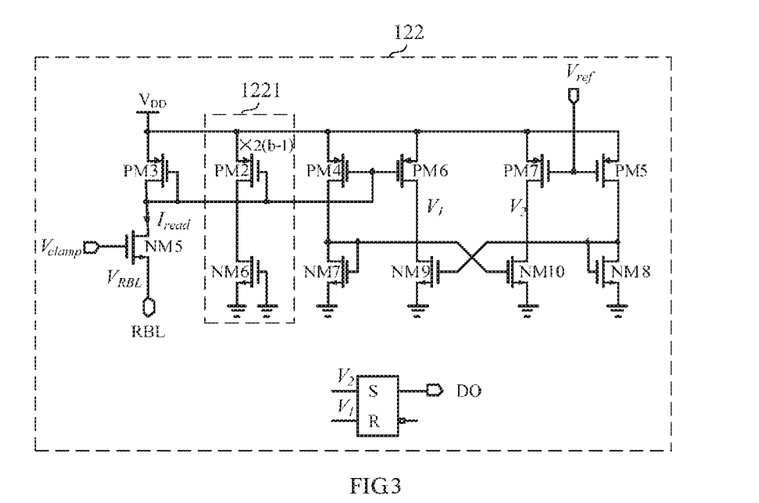
FIG. 3 is a conceptual schematic of the sense amplifier according to an embodiment of the invention.

As shown in FIG. 2, according to an embodiment of the invention, the said memory block 121 includes multiple memory cells; row selector is word line WL1~WLn; column selector is bit line LBL1~LBLm; only one word line and one bit line will be simultaneously selected at the same time. In each memory block, there are n word lines; there are n memory cells connected to each bit line; m bit lines share a sense amplifier 122; there are b sense amplifiers connected to a same read reference circuit 21 in the said array 22. Values of n, m and b are not limited to specific values, and they can be set according to actual needs. As shown in FIG. 3, each said memory cell 1211 is a 1T1R cell. Each said memory cell 1211 comprises a second memory device $R_{GST2}$ and a third select device NM4 and NM4 is an nMOS transistor. In an embodiment, the memory cell 1211 in row 2 and column 3 is illustrated as an example. The said second memory device $R_{GST2}$ is connected between bit line LBL3 and the said third select device NM4. The gate of the said third select device NM4 is controlled by word line WL2 and the source of the said third select device NM4 is connected to the around.

As shown in FIG. 3, according to an embodiment of the invention, the said sense amplifier 122 comprises a second nMOS transistor NM5 used to generate the read current $I_{read}$ from the selected memory cell 1211, a first current mirror used to copy the said read current $I_{read}$, a second current mirror used to copy the said read reference current $I_{ref}$, a comparator used to compare the said read current $I_{read}$ and the said read reference current $I_{ref}$ and a SR latch. The gate of the said second nMOS transistor NM5 is connected to the said clamp voltage $V_{clamp}$ and the source of NM5 is connected to the selected memory cell 1211 through a read transmission gate RTG3. The said first current mirror comprises pMOS transistors PM3, PM4 and PM6. The gates of PM3, PM4 and PM6 are connected to the drain of the said second nMOS transistor NM5; the sources of PM3, PM4 and PM6 are connected to the supply voltage VDD; the gate of PM3 is connected to the drain of PM3. The said second current mirror comprises pMOS transistors PM5 and PM7. The gates of PM5 and PM7 are connected to the said read reference voltage $V_{ref}$; the sources of PM5 and PM7 are connected to the supply voltage VDD. The said comparator is connected to the said first current mirror and the said second current mirror and outputs a readout result DO representing state of the selected memory device. The said comparator comprises nMOS transistors NM7, NM8, NM9 and NM10. The sources of NM7, NM8, NM9 and NM10 are connected to the ground; the gate of NM7 is connected to the drain of NM7 and the gate of NM10; the drain of NM7 is connected to the drain of PM4; the drain of NM9 is connected to the drain of PM6 as a first output V1; the drain of NM10 is connected to the drain of PM7 as a second output V2; the gate of NM8 is connected to the drain of NM8 and the gate of NM9. V1 and V2 are differential signals; R port of SR latch is connected to V1; S port of SR latch is connected to V2; SR latch generates a digital output signal DO from differential signals V1 and V2.

As shown in FIG. 3, according to an embodiment of the invention, the said sense amplifier 122 further comprises a current mirror parasitic parameters matching circuit 1221 used to provide the same current mirror parasitic parameters as the reference side for the said read current. The said current mirror parasitic parameters matching circuit 1221 comprises a second pMOS transistor PM2 used to provide the same current mirror parasitic parameters as the reference side for the said read current and a third nMOS transistor NM6 used to switch off the said second pMOS transistor PM2 and the said second nMOS transistor NM5. The source and the gate of the said third nMOS transistor NM6 are connected to the ground with the drain of the said third nMOS transistor NM6 connected to the drain of the said second pMOS transistor PM2; the source of the said second pMOS transistor PM2 is connected to the supply voltage with the gate of the said second pMOS transistor PM2 connected to the gates of PM3, PM4 and PM6. The said second pMOS transistor PM2 shares the same width and length with the said first current mirror PM3, PM4, PM6 and the said second current mirror PM5, PM7. Multiplier of the said second pMOS transistor PM2 is 2(b−1), where b is the number of sense amplifiers in the said array 12. In the read operation, there are 2b+1 pMOS transistors in the reference side; there are 2b+1 pMOS transistors in the read side. In this way, LRS Tread and FIRS Tread have the same current mirror parasitic parameters and similar changing trend with Iref. Iref is between LRS Iread and HRS Iread from an early stage. This eliminates pseudo reading and reduces the read access time.

In an embodiment, when memory device of the selected memory cell is in LRS, $I_{read} > I_{ref}$; by the operation of the said first current mirror and the second current mirror, PM6 and NM10 copy $I_{read}$, while PM7 and NM9 copy $I_{ref}$; in a same current branch, PM6 copies a larger current than NM9 does, so V1 will rise to near VDD; in a same current branch, NM10 copies a larger current than PM7 does, so V2 will drop to near 0V; DO of the SR latch will output VDD or "1". When memory device of the selected memory cell is in HRS, $I_{read} < I_{ref}$; by the operation of the said first current mirror and the second current mirror, PM6 and NM10 copy $I_{read}$, while PM7 and NM9 copy $I_{ref}$; in a same current branch, PM6 copies a smaller current than NM9 does, so V1 will drop to near 0V; in a same current branch, NM10 copies a smaller current than PM7 does, so V2 will rise to near VDD; DO of the SR latch will output 0V or "0".

Figure 4:
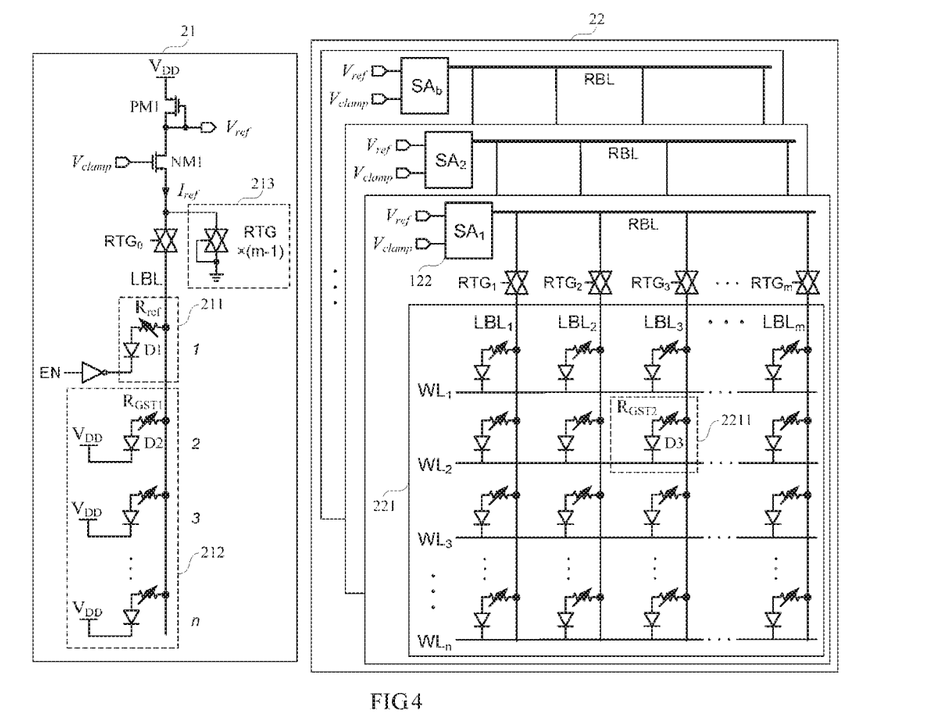
FIG. 4 is a conceptual schematic of the read reference circuit and the array for diode-type selector application according to an embodiment of the invention.

As shown in FIG. 4, according to an embodiment of the invention, a read circuit of storage class memory comprises: an array 22, including at least one memory block 221 and a sense amplifier 122 used to read the said memory block 221, bit lines in each said memory block are connected to the said sense amplifier 122 through a read transmission gate; a read reference circuit 21, having the same bit line parasitic parameters as the said array 22, having the same read transmission gate parasitic parameters as the said array 22, used to generate a read reference current $I_{ref}$ which is between the low resistance state read current and the high resistance state read current from an early stage; wherein the said sense amplifier 122, used to generate the read current $I_{read}$ from a selected memory cell, compare $I_{read}$ with the read reference current $I_{ref}$ provided by the said read reference circuit 11 and output a readout result.

As shown in FIG. 4, according to an embodiment of the invention, the said read reference circuit 21 comprises a reference cell 211 comprising a reference resistance $R_{ref}$ and a first select device D1, used to provide a reference resistance to distinguish low resistance state from high resistance state. D1 is a diode. The said reference resistance $R_{ref}$ is connected between the anode of the said first select device D1 and a first read transmission gate RTG0; enable signal EN connects to the input of a inverter; and the output of the said inverter control the cathode of the said first select device D1. In 1D1R cell, when the voltage of diode's cathode is 0V, diode is switched on; when the voltage of diode's cathode is VDD, diode is switched off. The said reference resistance $R_{ref}$ is set between the highest resistance in low resistance state distributions and the lowest resistance in high resistance state distributions.

As shown in FIG. 4, according to an embodiment of the invention, the said read reference circuit 21 further comprises n-1 dummy memory cells 212 providing the same bit line parasitic parameters as the said array 22, wherein n is the number of memory cells on each bit line in the said array 22. Each said dummy memory cell comprises a first memory device $R_{GST1}$ and a second select device D2 which is always switched off. D2 is a diode. The said first memory device $R_{GST1}$ is connected between the anode of the said second select device D2 and the said first read transmission gate RTG0; the cathode of the said second select device D2 is connected to the supply voltage VDD. In the read operation, there are one selected cell and n-1 unselected cell in the reference side; there are one selected cell and n-1 unselected cell in the read side. In this way, $I_{ref}$ has the same bit line parasitic parameters and similar changing trend with LRS $I_{read}$ and HRS $I_{read}$. $I_{ref}$ is between LRS $I_{read}$ and HRS $I_{read}$ from an early stage. This eliminates pseudo reading and reduces the read access time.

As shown in FIG. 4, according to an embodiment of the invention, the said read reference circuit 21 further comprises a dummy read transmission gate 213, connected between the source of a first nMOS transistor NM1 and the ground, used to provide the same read transmission gate parasitic parameters as the said array 22 for the said read reference current. The said dummy read transmission gate 213 shares a same circuit topology, width and length with the said first read transmission gate RTG0 and the read transmission gate RTGm in the said array 22. Multiplier of the said dummy read transmission gate 213 is m-1, where m is the number of bit lines sharing a sense amplifier. The said dummy read transmission gate 213 is always switched off with its control terminal connected to the ground. In the read operation, there are one selected read transmission gate and m-1 unselected read transmission gates in the reference side; there are one selected read transmission gate and m-1 unselected read transmission gates in the read side. In this way, $I_{ref}$ has the same read transmission gate parasitic parameters and similar changing trend with LRS $I_{read}$ and HRS $I_{read}$. $I_{ref}$ is between LRS $I_{read}$ and HRS Iread from an early stage. This eliminates pseudo reading and reduces the read access time.

As shown in FIG. 4, according to an embodiment of the invention, the said read reference circuit 21 further comprises a first pMOS transistor PM1 and the said first nMOS transistor NM1. The said first nMOS transistor NM1 is used to generate the said read reference current $I_{ref}$ from the said reference cell 211, the said n-1 dummy memory cells 212, the said first read transmission gate RTG0 and the said dummy read transmission gate 213 with the help of a clamp voltage $V_{clamp}$. The said first pMOS transistor PM1 is used as a current mirror to transmit the said read reference current $I_{ref}$ to the said sense amplifier 122. The source of the said first nMOS transistor NM1 is connected to the said first read transmission gate RTG0 with the gate of the said first nMOS transistor NM1 connected to the said clamp voltage $V_{clamp}$; the drain of the said first nMOS transistor NM1 is connected to the drain of the said first pMOS transistor PM1; the source of the said first pMOS transistor PM1 is connected to the supply voltage VDD with the gate of the said first pMOS transistor PM1 connected to the drain of the said first pMOS transistor PM1; the gate of the said first pMOS transistor PM1 output a read reference voltage $V_{ref}$.

As shown in FIG. 4, according to an embodiment of the invention, the said memory block 221 includes multiple memory cells; row control signal is word line WL1~WLn; column selector is bit line LBL1~LBLm; only one word line and one bit line will be simultaneously selected at the same time. In each memory block, there are n word lines; there are n memory cells connected to each bit line, m bit lines sharing a sense amplifier 122; there are b sense amplifiers connected to a same read reference circuit 21 in the said array 22. Values of n, m and b are not limited to specific values, and they can be set according to actual needs. As shown in FIG. 4, each said memory cell 2211 is a 1D1R cell. Each said memory cell 2211 comprises a second memory device $R_{GST2}$ and a third select device D3. D3 is a diode. In an embodiment, the memory cell 2211 in row 2 and column 3 is illustrated as an example. The said second memory device $R_{GST2}$ is connected between bit line LBL3 and the anode of the said third select device D3 and the cathode of the said third select device D3 is controlled by word line WL2.

As shown in FIG. 3, according to an embodiment of the invention, the said sense amplifier 122 comprises a second nMOS transistor NM5 used to generate the read current $I_{read}$ from the selected memory cell 2211, a first current mirror used to copy the said read current $I_{read}$, a second current mirror used to copy the said read reference current $I_{ref}$, a comparator used to compare the said read current $I_{read}$ and the said read reference current $I_{ref}$ and a SR latch. The gate of the said second nMOS transistor NM5 is connected to the said clamp voltage $V_{clamp}$ and the source of NM5 is connected to the selected memory cell 2211 through a read transmission gate RTG3.

Figure 5:
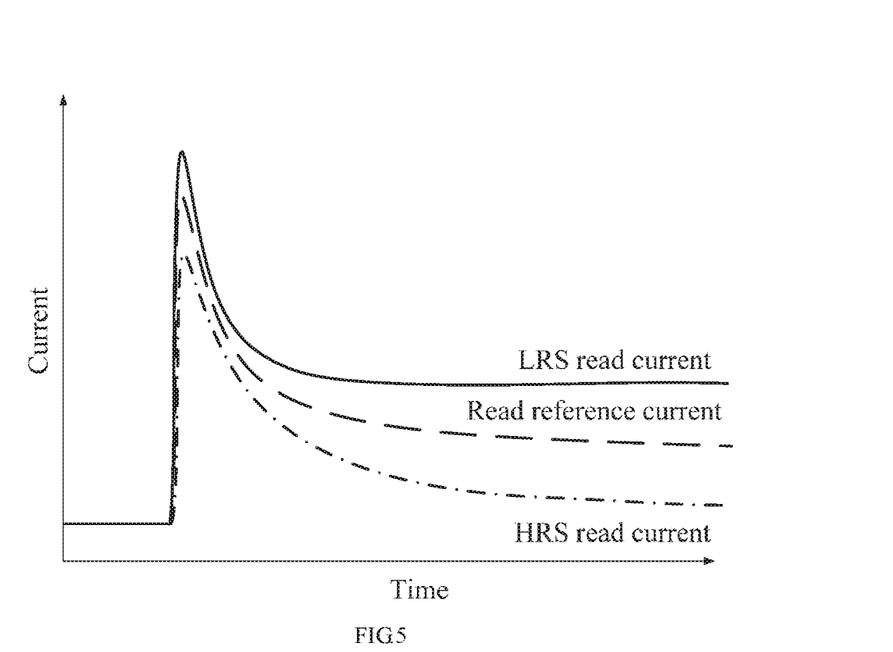
FIG. 5 is a plot of the read current and the read reference current versus time according to an embodiment of the invention.

FIG. 5 is a plot of the read current $I_{read}$ and the read reference current $I_{ref}$ versus time according to an embodiment of the invention. $I_{ref}$ first rises to its maximum current, then begins to drop in a natural exponential curve, finally reaches a stable value. $I_{ref}$ curve has been between LRS $I_{read}$ and HRS $I_{read}$ from an early stage, since reference cell and selected memory cell have the same parasitic parameters. Distinguishing point of the present invention is much earlier than distinguishing point of the conventional method. In this way, the read access time is largely reduced.

Figure 6:
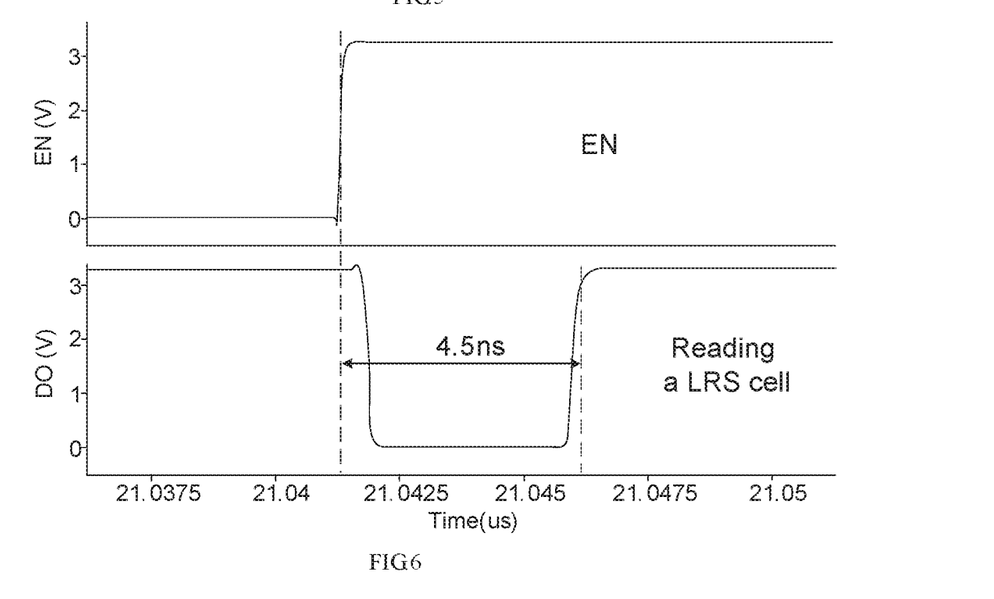
FIG. 6 is the simulation result of a 128 Kb PCM reading a LRS cell according to an embodiment of the invention.
Figure 7:
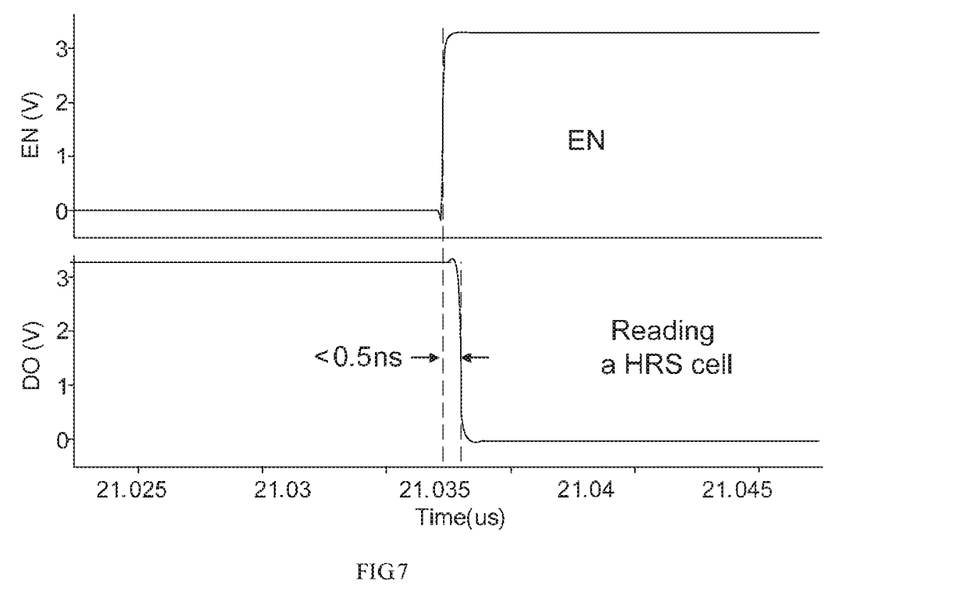
FIG. 7 is the simulation result of a 128 Kb PCM reading a HRS cell according to an embodiment of the invention.

FIG. 6 and FIG. 7 are the simulation results of a 128 Kb PCM reading a LRS cell and a HRS cell respectively according to an embodiment of the invention. In this chip, 1T1R memory cells are used, bit line length is 1024 and 32 bit lines share a sense amplifier. The chip is designed in 130 nm CMOS process. EN is the enable signal. When EN rises from 0V to VDD, a memory cell is selected in the said array and the read reference circuit and the said sense amplifier begin to operate. When reading a LRS cell, readout time is 4.5 ns; when reading a HRS cell, readout time is 0.5 ns. The read access time is 4.5 ns, which is determined by LRS speed. In contrast, the read access time of 128 Kb PCM using conventional method is about 80 ns.

To sum up, in the read circuit of storage class memory of the present invention, it is not until the read signal is valid that the read reference circuit begins to operate, so the read reference circuit can generate a changing read reference current; considering parasitic parameters effect on the read current and the read reference current, the read circuit of storage class memory of the present invention provides the same bit line parasitic parameters and the same read transmission gate parasitic parameters as the array for the read reference current, as well as the same current mirror parasitic parameters as the reference side for the said read current. By these two means, the transient curve of the read reference current is between the low resistance state read current and the high resistance state read current from an early stage. The present invention reduces the pseudo reading zone and the read access time. In the present invention, the read reference circuit outputs the read reference voltage to sense amplifiers. Voltage signal transmits fast and can be multiplex in multiple sense amplifiers. It is very suitable for large scale memory. It is area-saving and energy-saving comparing with conventional signal transmitting. The present invention can reduce the read access time in application from 1 Kb to 1 Tb memory. In the present invention, design of different parasitic parameters matching can be utilized by simple change of transistors' numbers. The present invention is easy to use in the practical product. The present invention is perfectly symmetric in terms of circuit topology and parasitic parameters. It has a wide sensing margin and a good process variation tolerance.

While the present invention has been described with respect to a limited number of embodiments, those skilled in the art will make numerous modifications and variations there from. It is intended that the appended claims cover all such modifications and variations as fall within the true spirit and scope of this present invention.

What is claimed is:

1. A read circuit of storage class memory, the read circuit comprising:
   an array, including at least one memory block and a sense amplifier used to read the memory block, wherein bit lines in each said memory block are connected to the sense amplifier through a read transmission gate; and
   a read reference circuit, having the same bit line parasitic parameters as the array, having the same read transmission gate parasitic parameters as the array, used to generate a read reference current which is between the low resistance state read current and the high resistance state read current;
   wherein the sense amplifier, used to generate a read current from a selected memory cell, compare the read current with the read reference current provided by the read reference circuit and output a readout result;
   wherein the read reference circuit further comprises a dummy read transmission gate, connected between the source of a first nMOS transistor and the ground, used to provide the same read transmission gate parasitic parameters as the array for the read reference current;
   wherein the sense amplifier comprises a second nMOS transistor used to generate the read current from the selected memory cell, a first current mirror used to copy the read current, a second current mirror used to copy the read reference current and a comparator used to compare the read current and the read reference current, wherein the gate of the second nMOS transistor is connected to a clamp voltage, wherein the source of the second nMOS transistor is connected to the selected memory cell through a read transmission gate, wherein the first current mirror is connected to the drain of the second nMOS transistor, wherein the gates of the transistors of the second current mirror are connected to the read reference voltage, wherein the comparator is connected to the first current mirror and the second current mirror, wherein the comparator outputs a readout result representing state of the memory device of the selected memory cell.

2. The read circuit of storage class memory according to claim 1, wherein the read reference circuit comprises a reference cell comprising a reference resistance and a first select device, used to provide a reference resistance to distinguish low resistance state from high resistance state.

3. The read circuit of storage class memory according to claim 2, wherein the reference resistance is connected between the first select device and a first read transmission gate, wherein the control terminal of the first select device is controlled by an enable signal.

4. The read circuit of storage class memory according to claim 2, wherein the reference resistance is set between the highest resistance in low resistance state distributions and the lowest resistance in high resistance state distributions.

5. The read circuit of storage class memory according to claim 1, wherein the read reference circuit further comprises n−1 dummy memory cells providing the same bit line parasitic parameters as the array, wherein n is the number of memory cells on each bit line in the array, n is number of memory cells on each bit line.

6. The read circuit of storage class memory according to claim 5, wherein each said dummy memory cell comprises a first memory device and a second select device which is always switched off, wherein the first memory device is connected between the second select device and a first read transmission gate.

7. The read circuit of storage class memory according to claim 1, wherein the dummy read transmission gate shares a same circuit topology, width and length with a first read transmission gate and a read transmission gate in the array, wherein multiplier of the dummy read transmission gate is m−1, wherein m is the number of bit lines sharing a sense amplifier, wherein the dummy read transmission gate is always switched off with its control terminal connected to the ground.

8. The read circuit of storage class memory according to claim 1, wherein the read reference circuit further comprises a first pMOS transistor and a first nMOS transistor, wherein the first nMOS transistor is used to generate the read reference current from a reference cell, n−1 dummy memory cells, a first read transmission gate and the dummy read transmission gate with the help of a clamp voltage, wherein the first pMOS transistor is used as a current mirror to transmit the read reference current to the sense amplifier, n is number of memory cells on each bit line.

9. The read circuit of storage class memory according to claim 8, wherein the source of the first nMOS transistor is connected to the first read transmission gate with the gate of the first nMOS transistor connected to the clamp voltage, wherein the drain of the first nMOS transistor is connected to the drain of the first pMOS transistor, wherein the source of the first pMOS transistor is connected to the supply voltage with the gate of the first pMOS transistor connected to the drain of the first pMOS transistor, wherein the gate of the first pMOS transistor outputs a read reference voltage.

10. The read circuit of storage class memory according to claim 1, wherein the reference circuit and the sense amplifier begin to work at the same time.

11. The read circuit of storage class memory according to claim 1, wherein the read reference current and the read current begin to rise at the same time.

12. The read circuit of storage class memory according to claim 1, wherein the sense amplifier further comprises a current mirror parasitic parameters matching circuit used to provide the same current mirror parasitic parameters as the reference side for the read current.

13. The read circuit of storage class memory according to claim 12, wherein the current mirror parasitic parameters matching circuit comprises a second pMOS transistor used to provide the same current mirror parasitic parameters as the reference side for the read current and a third nMOS transistor used to switch off the second pMOS transistor and the second nMOS transistor.

14. The read circuit of storage class memory according to claim 13, wherein the source and the gate of the third nMOS transistor are connected to the ground with the drain of the third nMOS transistor connected to the drain of the second pMOS transistor, wherein the source of the second pMOS transistor is connected to the supply voltage with the gate of the second pMOS transistor connected to the gates of the transistors of the first current mirror, wherein the second pMOS transistor shares the same width and length with the first current mirror and the second current mirror, wherein multiplier of the second pMOS transistor is 2(b−1), wherein b is the number of sense amplifiers in the array.

* * * * *